United States Patent [19]

Wood et al.

[11] 4,303,480
[45] Dec. 1, 1981

[54] ELECTROPLATING OF THICK FILM CIRCUITRY

[75] Inventors: John H. Wood, Balboa Island; Victor A. Twaddell, Santa Ana, both of Calif.

[73] Assignee: General Dynamics, Pomona Division, Pomona, Calif.

[21] Appl. No.: 821,004

[22] Filed: Aug. 1, 1977

[51] Int. Cl.³ .............................................. C25D 5/02
[52] U.S. Cl. ..................................... 204/15; 204/38 B
[58] Field of Search ...................... 204/15, 38 B, 38 C

[56] References Cited

U.S. PATENT DOCUMENTS

| 3,549,784 | 12/1970 | Hargis ................................ 204/15 |
| 3,576,722 | 4/1971 | Fennimore et al. .................. 204/15 |
| 3,666,639 | 5/1972 | De Forest et al. .............. 204/38 C |
| 3,811,934 | 5/1974 | Glaser ............................. 204/38 B |

OTHER PUBLICATIONS

Plating, May 1970, pp. 479–483; May 1969, pp. 505–510.

*Primary Examiner*—T. M. Tufariello

*Attorney, Agent, or Firm*—Henry M. Bissell; Edward B. Johnson

[57] ABSTRACT

The improved circuit composite of the present invention is of the thick film type, but is readily solderable, weldable and bondable to wire without oxidizing. The composite comprises a refractory substrate such as alumina, beryllia or zirconia, a thick printed film pattern of oxidizable electrically conductive metal such as copper, nickel, or silver bonded to the substrate, and a thin electroplated film of non-oxidizable electrically conductive metal, such as gold or platinum, enclosing and adhering to the thick film pattern. The then-electroplated film allows wires and contacts to be soldered, welded or bonded to the pattern, as by ultrasonic or thermocompression bonding, without degrading the quality of the contact area and while permitting removal and subsequent reattachment of such wires and contacts. The method is simple, inexpensive and efficient. It calls for forming the thick film on the substrate and then electroplating the thin film thereover. The method results in durable circuit composites, particularly microcircuit composites of high quality and improved utility.

10 Claims, 1 Drawing Figure

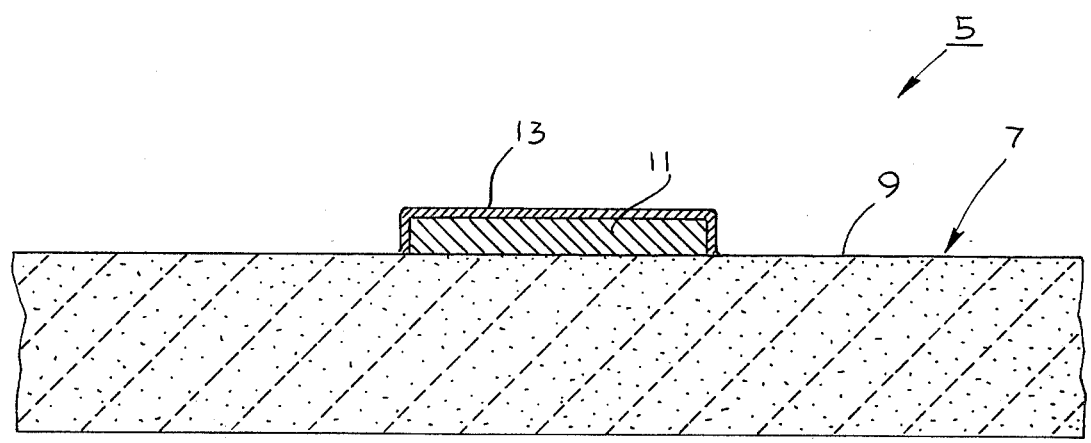

ELECTROPLATING OF THICK FILM CIRCUITRY

BACKGROUND OF THE INVENTION

1. Field of the Invention

The present invention generally relates to electrical circuitry and more particularly to improved thick film circuit composites such as microcircuit composites and methods of making the same.

2. Description of the Prior Art

Numerous techniques have been used to fabricate electrical circuitry and microcircuitry. One such technique is exemplified in U.S. Pat. No. 3,267,007 wherein a non-conductive substrate is coated with an adhesive resin. A film of metal is then deposited on the resin, as by vacuum deposition or electroless plating, whereupon the resin is cured from the B stage to the C stage, after which a plating resist is applied in a desired pattern over the metal film and plating on the desired metal is carried out. The procedure is lengthy and involved and still may result in poor adhesion to the substrate.

Another technique is disclosed in U.S. Pat. No. 3,653,946 wherein a gold film is formed and secured to a substrate by coating the substrate by a screen printing technique with a mixture of resinates, including gold resinate, and then heating the coated substrate at an elevated temperature to decompose the resinates. Such a technique is expensive and has limited applications.

A third technique is disclosed in U.S. Pat. No. 1,563,731 wherein a substrate of low melting point conductive material is covered with a thin meltable non-conductive film, after which a circuit pattern is cut through the film into the conductive material. Metal is then plated in the pattern, after which the non-conductive film and the substrate are melted away, leaving the desired circuit. This technique is not well adapted for fabrication of microcircuitry.

Still further techniques involve cutting or etching pattern in conductive materials, electroplating or electroless plating on conductive metal sheets, etc., depending on the particular characteristics and applications of the desired products.

One particularly useful technique involves screen printing a pattern of a thick paste of copper powder and a binder on a ceramic substrate and then firing the composite to form a desired thick film circuit pattern of the order of about 0.0005–0.001 inch thick. Unfortunately, when it is desired to weld, solder or otherwise high-temperature-bond wiring to the patterns, oxidation of the copper occurs, resulting in a bond which may have impaired electrical conductivity. It would be very desirable to overcome this drawback in a simple, inexpensive manner.

SUMMARY OF THE INVENTION

The foregoing needs have been satisfied by the improved thick film circuit composite of the present invention and the present method of making the same. The composite and method are particularly directed to microcircuits and are substantially as set forth in the Abstract above. Thus, in accordance with the present method, a thick wet paste or liquid mixture of oxidizable conductive metal such as copper, nickel, or silver and binder such as organic binder plus reactive oxides or the like is deposited in a pattern by a screen printing technique on a refractory substrate such as alumina, beryllia, zirconia or the like, then fired at high temperature, for example about 900° C. or more, in an inert atmosphere such as nitrogen to bond the metal as a pattern of thick film, of example, about 0.005–0.001 inch thick, to the substrate.

The thick film pattern is then elecroplated with a thin film of essentially non-oxidizable metal, such as gold, platinum, palladium, etc., usually about 0.00005–0.0002 inch thick. The thin film adheres to and totally encloses and protects the thick film while the thick film provides the necessary structural integrity. The thin film permits wiring to be welded, soldered or otherwise bonded at high temperature to the composite without danger of inferior electrical conductivity at the bonding site due to oxidation. The thin film also permits easy removal and reattachment of the wiring and other electrical contacts as desired, so as to extend the life and utility of the composite while improving its electrical characteristics. Further features are set forth in the following detailed description and drawings.

BRIEF DESCRIPTION OF THE DRAWING

The single FIGURE depicts schematically an enlarged fragmentary cross-section of a preferred embodiment of the improved thick film circuit composite of the present invention.

DESCRIPTION OF THE PREFERRED EMBODIMENT

Now referring more particularly to the single figure of the accompanying drawing, a preferred embodiment of the improved composite of the present invention is schematically depicted therein in enlarged fragmentary cross-section. Thus, composite 5 is shown, which includes a solid substrate of a refractory or ceramic material, such as alumina, preferably about 96–99.6% pure alumina, or beryllia, zirconia, magnesia or other refractory metal oxide or mixture of oxides or the like capable of withstanding firing temperatures of the order of about 900° C. without degradation. Preferably, the upper surface 9 of substrate 7 is sufficiently rough or textured so as to facilitate bonding of a thick metal film 11 thereto. For such purposes, commercial 96% alumina substrates usually have the most desirable surface texture.

Thick metal film 11 is usually of the order of about 0.0005–0.001 inch and is in the form of a circuit pattern, preferably a microcircuit pattern, bonded to surface 9. The metal of film 11 is highly electrically conductive but may be subject to oxidation at elevated temperature. Fore example, copper, nickel, silver and the like are suitable metals for use as film 11.

Film 11 preferably is formed in the desired pattern on substrate 7 in accordance with the method of the present invention. The method calls for printing a wet mixture of the desired metal in powered form with a binder in a desired conductor pattern on the substrate and then drying the mixture on the substrate in an air atmosphere to remove volatilizable and degradable binder and subsequently firing the mixture in an inert atmosphere to bond the metal to the substrate surface in the desired pattern.

A conventional technique for forming thick film circuitry may be employed. Thus, in carrying out this procedure, a mask may be formed in a screen to provide the desired circuit pattern. The metal powder-binder mixture is then squeezed through the screen with its mask so that the mixture is, in effect, printed on surface 9 of substrate 7. The metal powder may be, for example, of average particle size to pass through a 400 U.S. Standard Mesh screen or the like.

The binder may be a combination of organic resins, such as pine resins, and inorganic composites of barium, phosphorous, carbon, lead, silicon, calcium and bismuth. The concentrations of these binder constituents may vary from 0.5% to 10% by total weight of mixture. It may compromise for example, a barium, lead, bismuth and calcium inorganic composite dispensed uniformly in a highly volatile organic pine resin. Within the composition of the mixture, reactive oxides such as cadmium oxide, copper oxide and antimony oxide may be present in small quantities from 0.1 to 1.0% by weight of mixture. A sufficient thickness of the wet mixture is squeezed onto surface 9 so that the final fired pattern of the metal, that is, film 11, will be the desired thickness.

Firing of the squeezed mixture on surface 9 is carried out in an inert atmosphere such as helium, argon or nitrogen (in order to avoid excessive oxidation of the metal powder) and after dying the mixture, which volatizes the organic binder prior to firing, leaving a conductive residue, if any, of carbon, plus the inorganic binder to bond the metal during the firing operation as a continuous film 11 on surface 9. The particular drying and firing temperatures and times selected will depend on the particular binders employed in the mixture and other factors. Typically, a drying temperature of about 90°–150° C. may be employed over about 5–15 minutes. A peak firing temperature of about 900° C. may be employed for about 5–10 minutes in the presence of a flow of nitrogen, for example, 200–300 SCFH.

Once the firing procedure is complete, cooling of film 11 in nitrogen or other inert gas may be effected to below, for example, about 200° C., whereupon a thin film 13 of high conductive metal which is resistant to oxidation at elevated temperature is electroplated on film 11 to enclose the same, as shown in FIG. 1. Preferably, film 13 is formed of gold, platinum, or other suitable metal and is relatively thin, for example, about 0.00005–0.0002 inch thick, preferably about 0.0001 inch thick.

Any conventional electroplating technique can be employed to deposite the adherent film 13 over film 11. Thus, for example, a conventional gold plating tank operation at 65° C., 40V and 1.2 amps per sq. ft. and utilizing a conventional gold salt electrolyte composition sold under the trademark of Ortotemp 24 by Technic, Inc. can be used to electroplate approximately 0.0001 inch thickness of gold on film 11 in 45 minutes. Other electroplating parameters can be employed, including different electrolytes, voltages, currents, electrodes, temperatures and times to provide the desired results.

The finished circuit composite 5 is then ready for use. Composite 5 has the advantage of providing circuitry in the form of a core of thick film 11 of oxidizable metal, such as copper or the like, fully protected by and overlaid with a sheath of thin film 13 of essentially non-oxidizable metal. The metal of film 13 is normally expensive and is preferably used in a thin layer. It can be easily and rapidly provided by the electroplating technique. The thicker core or film 11 is of relatively inexpensive metal which is easily and rapidly provided by the thick film printing technique. Both metals are highly electrically conductive. The metal of film 13 has the advantage of permitting repeated welding, soldering and thermal bonding to it of wires, leads and the like without oxidizing and thus impairing the electrical conductivity at the bonding site in contrast to more readily oxidizable metals such as those used for film 11. Moreover, film 11 leads improved strength and adhesion to the composite when compared to pure gold circuitry, especially in its ability to withstand reworking (removal and replacement of contacts). Film 13 imparts freedom from oxidation to the composite to improve its utility and longevity. Improved composite 5 is easily, inexpensively and rapidly fabricated by the present method and has the improved characteristics noted above over the composites of the prior art. Further features are delineated by the following specific examples:

EXAMPLE I

An improved thick film circuit composite is prepared by the following procedure: a desired circuit pattern is formed on a 325 mesh photosensitive emulsion-covered screen strung at 45° angle, with a total wire and emulsion thickness of 2.7 mils. The screen is then placed agains a 96% alumina substrate which has been previously cleaned at 875°±20° for 5 minutes. A thick film paste comprising Cermalloy 7029, a trademarked item of Cermalloy, Cermet Division of Bala Electronics Corporation, having the composition of 88% by weight copper powder (400 mesh) and 10% of binder comprising barium, phosphorus, lead and carbon, is squeezed through the screen onto the substrate surface. The pattern of paste is dried for 10 minutes at 135° C. on the substrate and then fired in nitrogen (250 SCFH) at 900° C. for 5–10 minutes. The pattern has an average thickness of about 0.0007 inch. The fired composite is then cleaned, dried and gold-electroplated using platinum-plated titanium anodes, at 65° C., a pH of 6.0, 40 V and 1.2 amps/sq. ft. for 45 minutes in Orotemp 24 (Technic) having the following composition:

TABLE I

| Constituents | Concentration |
| --- | --- |
| Orotemp Additive #1 | 1.5 lbs/gallon |
| Gold, as Orotemp 24 salts | 1 tr. oz/gallon |
| Phosphoric Acid/Potassium Hydroxide | as required to maintain pH |
| Monopotassium phosphate | as required to maintain specific gravity |

The gold plating operation results in a thin film of about 0.0001 inch in thickness deposited over, adherent to, and enclosing the thick film of copper. The finished composite is removed from the electroplating bath, rinsed with deionized water and dried. It is strong and has substantial durability. Moreover, its utility is improved, when compared with conventional thick film composites, because in contrast to those composites, wiring, contacts, etc. can be repeatedly soldered, welded or otherwise attached to it, removed and re-attached without oxidizing and impairing the contact area on the rest of the film. Electrical conductivity remains high.

The foregoing Example demonstrates that the present method, utilizing only a few simple steps and readily available material, rapidly and inexpensively provides the desired improved composite. Various modifications, changes, alterations and additions can be made in the improved composite of the present invention, its components and parameters, and in the present method, its steps and parameters. All such modifications, changes, alterations and additions as are within the scope of the appended claims form part of the present invention.

What is claimed is:

1. An improved direct thermobondable and solderable thin film-thick film printed circuit composite consisting essentially of, in combination:
   (a) a refractory substrate comprising alumina;
   (b) a thick printed film of copper bonded to said substrate; and
   (c) a thin electroplated film of gold enclosing and adherent to said thick film.

2. The improved composite of claim 1 wherein said thick film is of the order of about 0.0005–0.001 inch thick, and wherein said thin film is of the order of about 0.00005–0.0002 inch thick.

3. The improved composite of claim 1 wherein said composite is a microcircuit composite, wherein said thick film is about 0.0007 inch thick and wherein said thin film is about 0.0001 inch thick.

4. The method of making an improved directly thermobondable and solderable, thin-film-over-thick-film, printed circuit composite, said method consisting essentially of the steps of:
   (a) printing a wet mixture of particulate, oxidizable, electrically conductive metal and binder in a desired thick film pattern on a refractory substrate, said thick film pattern being about 0.0005–0.001 inch thick;
   (b) drying the mixture in air to remove moisture;
   (c) firing said mixture on said substrate at about 900° C. in nitrogen to bond the metal in said thick film pattern to said substrate;
   (d) electroplating a thin, adherent film of gold which is essentially non-oxidizable and electrically conductive to enclose said thick film on said substrate; and
   (e) continuing the electroplating until said electroplated gold film is about 0.00005–0.0002 inch thick.

5. The method of claim 4 wherein said substrate comprises alumina, and wherein said metal in said wet mixture comprises copper.

6. The method of claim 4 wherein said electroplated film is about 0.0001 inch thick, wherein said pattern is copper about 0.0007 inch thick and wherein said substrate is alumina.

7. The method of claim 4 wherein the printing step further comprises forming a circuit pattern for said composite on a photosensitive emulsion-covered screen to a total thickness for both wire and emulsion of 2.7 mils.

8. The method of claim 7 wherein said screen is constructed of 325 mesh wire strung at a 45° angle.

9. The method of claim 7 wherein said printing step further comprises placing the screen against a 96% alumina substrate and squeezing the wet mixture of metal and binder in paste form through the screen onto the substrate surface to form a pattern of paste corresponding to said composite.

10. The method of claim 4 further including the step of drying the printed thick pattern for 10 minutes at 135° C. before firing said mixture.

* * * * *